United States Patent [19]

Inoue et al.

[11] Patent Number: 5,413,968
[45] Date of Patent: May 9, 1995

[54] SEMICONDUCTOR DEVICE AND MANUFACTURING METHOD THEREOF

[75] Inventors: Yasuo Inoue; Kazuyuki Sugahara; Takashi Ipposhi; Yasuo Yamaguchi; Tadashi Nishimura, all of Hyogo, Japan

[73] Assignee: Mitsubishi Denki Kabushiki Kaisha, Tokyo, Japan

[21] Appl. No.: 22,876

[22] Filed: Feb. 25, 1993

Related U.S. Application Data

[62] Division of Ser. No. 612,699, Nov. 15, 1990, abandoned.

[30] Foreign Application Priority Data

Nov. 20, 1989 [JP] Japan .................................. 1-302592

[51] Int. Cl.$^6$ ............................................. H01L 21/44
[52] U.S. Cl. ................................... 437/200; 437/192; 437/193; 437/196
[58] Field of Search .................... 357/6, 59, 71, 67, 71, 357/59 I; 437/200, 183, 192, 193, 196, 201, 202, 203

[56] References Cited

U.S. PATENT DOCUMENTS

| | | | |
|---|---|---|---|
| 4,556,897 | 12/1985 | Yorikane et al. | 357/71 |
| 4,622,735 | 11/1986 | Shibata | 357/71 |
| 4,814,854 | 3/1989 | Tigelaar et al. | 357/67 |
| 4,884,123 | 11/1989 | Dixit et al. | 357/67 |
| 4,887,146 | 12/1989 | Hinode | 357/67 |
| 4,975,756 | 12/1990 | Haken et al. | 357/71 |
| 4,985,750 | 1/1991 | Hoshino | 357/71 |
| 4,987,562 | 1/1991 | Watanabe | 357/71 |
| 4,990,997 | 2/1991 | Nishida | 357/71 |
| 4,994,410 | 2/1991 | Sun et al. | 357/71 |
| 4,997,518 | 3/1991 | Madokoro | 357/71 |
| 4,998,157 | 3/1991 | Yokoyama et al. | 357/71 |
| 5,084,413 | 1/1992 | Fujita et al. | 437/200 |
| 5,108,941 | 4/1992 | Paterson et al. | 437/192 |

*Primary Examiner*—Brian E. Hearn
*Assistant Examiner*—Kevin M. Picardat
*Attorney, Agent, or Firm*—Lowe, Price, LeBlanc & Becker

[57] ABSTRACT

A semiconductor device includes a conductor layer (3, 7) having a silicon crystal, an insulator layer (5, 15) formed on the surface of the conductor layer (3, 7) having a contact hole therethrough to said surface of the conductor layer (3, 7), an interconnecting portion formed at a predetermined location in the insulator layer (5, 15) and having a contact hole (6, 9) the bottom surface of which becomes the surface of the conductor layer (3, 7), a barrier layer (14) formed at the bottom of said contact hole at least on the surface of the conductor layer (3, 7) in the interconnecting portion, and a metal silicide layer (12) formed on the barrier layer (14). This semiconductor device is manufactured by depositing the insulator layer (5, 15) having the contact hole (6, 9) on the conductor layer (3, 7) having the silicon crystal, forming the barrier layer (14) and the polysilicon layer (7, 10) overlapping each other in the contact hole (6, 9) and on the insulator layer (5, 15) and then patterning these overlapping barrier layer (14) and polysilicon layer (7, 10), forming a metal layer (8, 11) thereon to be silicidized, and removing unreacted metal. The semiconductor device thus manufactured prevents a suction of silicon from the conductor layer (3, 7) to the metal silicide layer (12) and hence prevents an increase in resistance value due to a deficiency of silicon produced in the conductor layer (3, 7), thereby minimizing a series resistance of the metal silicide layer (12), a contact portion and the conductor layer (3, 7).

5 Claims, 9 Drawing Sheets

SEMICONDUCTOR DEVICE AND MANUFACTURING METHOD THEREOF

This application is a divisional of application Ser. No. 07/612,699 filed Nov. 15, 1990, now abandoned.

BACKGROUND OF THE INVENTION

1. Field of the Invention

The present invention relates generally to semiconductor devices and manufacturing method thereof and, more particularly, to a semiconductor device in which a resistance of a polysilicon interconnection and a contact resistance of an interconnecting portion thereof are reduced, and a method of manufacturing such a semiconductor device.

2. Description of the Background Art

In recent years, as semiconductor devices such as semiconductor integrated circuit devices have been rapidly developed to be operable with higher performance and higher integration, a reduction in width or spacing of a conductive interconnection layer has also been increasingly required.

In order to achieve the reduction in width or spacing of the conductive interconnection layer, materials having lower resistivities need be employed for conductive interconnections as well as an enhanced technique of forming a more miniaturized conductive interconnection layer. As means for forming a miniaturized conductive interconnection layer, a polysilicon interconnection layer is employed which is made conductive by forming a polycrystalline silicon layer on an insulator film and then doping impurity ions such as phosphorus or boron into the formed polycrystalline silicon layer. To meet a demand for the reduction in resistivity for higher integration, as a technique has also been developing as to form a refractory metal layer such as tungsten, molybdenum or titanium on a surface of a polysilicon layer, then react this refractory metal layer with the polysilicon layer and form a conductive interconnection layer of refractory metal silicon.

As a method of forming a metal silicide layer, such a method can also be considered in which silicide is directly formed by sputtering or a CVD method. The sputtering is a method of sputtering metal atoms such as of titanium and silicon atoms to be adhered onto an insulator film and simultaneously react the atoms with each other, thereby to form a metal silicide layer having a thickness of submicron. By this method, however, in case of forming the metal silicide layer in a space having a high aspect ratio such as a contact hole, it is difficult to form the metal silicide layer which sufficiently fills the contact hole because the atoms do not distribute entirely at the bottom of the contact hole. By the CVD method, it is technically possible to form the metal silicide layer directly on the insulator film by reacting a gas containing titanium and the like with silane in vapor phase. This method is, however, still under development and is not practical especially for mass production.

Thus, a method in which a polysilicon layer and a metal layer are separately stacked in sequence and thereafter subjected to silicidation by a heat treatment has conventionally been adopted for formation of a metal silicide interconnection in a semiconductor device.

A description will now be given of a conventional conductive interconnection layer formed of metal silicide, with reference to FIGS. 1A and 1B. FIG. 1A shows a structure for forming a contact and an interconnection having a conventional structure of self-aligned silicide (hereinafter referred to as salicide). Here, the salicide structure means such a structure that only a polysilicon layer formed on an insulator film is silicidized in a self-aligned manner to form a metal silicide layer (refer to U.S. Pat. No. 4,622,735 and so on).

In manufacture of the structure shown in FIG. 1A, an impurity diffusion layer 3 doped with impurity ions such as phosphorus, a gate electrode 4 and an insulator layer 5 are first formed in regions isolated by a field oxide film 2 in the surface of a silicon substrate 1. Then, a contact hole 6 is formed in insulator layer 5 on the region of impurity diffusion layer 3 by etching. Thereafter, polysilicon is deposited in contact hole 6 and on insulator layer 5 by CVD, and unnecessary portions are etched away, thereby forming a polysilicon layer 7. Then, a metal layer 8 is deposited on the surface of polysilicon layer 7 and on the exposed surface of insulator layer 5 by sputtering.

After the structure shown in FIG. 1A is formed in the above-described manner, a heat treatment causes polysilicon layer 7 to react with metal layer 8, thereby to form a metal silicide layer. Then, removal of unreacted metal and a metal compound such as nitride enables formation of a metal silicide layer in a self-aligned manner.

FIG. 1B shows a structure for further forming a metal silicide interconnection layer on a polysilicon interconnection layer through a contact. In the manufacture shown in FIG. 1B, the process to the step of forming polysilicon layer 7 is the same as that shown in FIG. 1A. In this structure, an insulator layer 15 is further deposited on the surface of polysilicon layer 7 and on the surface of exposed insulator layer 5, and a contact hole 9 is made at a predetermined location in insulator layer 15 on polysilicon layer 7 by etching. Thereafter, a polysilicon layer 10 and a metal layer 11 are formed by the same method as the one employed for the formation of polysilicon layer 7 and metal layer 8 in FIG. 1A. A metal silicide layer is then formed by a heat treatment, and then the unreacted metal or metal compound is removed, thereby forming a metal silicide layer in a self-aligned manner.

A resistance value of a junction between the metal silicide interconnection thus formed and silicon substrate 1 or a resistance value of a junction between the metal silicide interconnection and polysilicon layer 7 differs according to the relative relation in thickness between metal layers 8, 11 before silicidized by heat treatment and polysilicon layers 7, 10. The reason for this will be described as follows with reference to FIGS. 2–5B.

FIG. 2 shows a state before a heat treatment is carried out for insulator layer 5 formed on silicon substrate 1 and having contact hole 6, polysilicon layer 7 deposited on the surface of insulator layer 5 and metal layer 8 formed on the surface of polysilicon layer 7 to cause silicidation. Based on the relative relation in thickness between polysilicon layer 7 and metal layer 8 in this state, the vicinity of the junction between silicon substrate 1 and the metal silicide layer silicidized by heat treatment provide the following three different states.

(1) When a heat treatment for silicidation starts in the state shown in FIG. 2, the silicidation advances from an interface between metal layer 8 and polysilicon layer 7 both upward and downward. Thus, when the thickness of metal layer 8 is sufficiently smaller than that of polysilicon layer 7, the heat treatment silicidizes the entire metal layer 8 and also leaves unreacted polysilicon layer 7 at lower portions. This causes polysilicon to come into contact with silicon substrate 1 at the bottom of contact hole 6 (see FIG. 3A). In this state, an equivalent circuit of resistance between the surface of a metal silicide layer 12 and that of silicon substrate 1 is shown in FIG. 3B. Referring to FIG. 3B, a symbol Rs denotes a resistance value of metal silicide layer 12 and Rp denotes a resistance value of unreacted polysilicon layer 7.

(2) In case where the relative relation in thickness between metal layer 8 and polysilicon layer 7 is appropriately set so that the silicidation of these layers is simultaneously completed over the entire thickness of both layers due to heat treatment, the layers become a state shown in FIG. 4A after heat treatment. That is, metal layer 8 and polysilicon layer 7 are both silicidized to form metal silicide layer 12. An equivalent circuit of resistance between the surface of metal silicon layer 12 and that of silicon substrate 1 in this case is shown in FIG. 4B.

(3) When the thickness of metal layer 8 is sufficiently larger than that of polysilicon layer 7, the entire polysilicon layer 7 is silicidized to become a portion of metal silicide layer 12. The metal layer 8 is also silicidized from the lower portion thereof to become metal silicide layer 12; however, after polysilicon layer 7 is all silicidized, the silicidation due to the reaction between metal layer 8 and polysilicon layer 7 stops, thereby leaving unreacted metal layer 8 in the vicinity of the surface. Thereafter, a portion of the metal in this unreacted metal layer 8 enters silicon substrate 1 through a junction (hereinafter referred to as a contact portion) between metal silicide layer 12 at the bottom of contact hole 6 and the surface of silicon substrate 1 and then silicidizes silicon substrate 1. Also, the silicon in silicon substrate 1 is suctioned upward through the contact portion, so as to silicidize unreacted metal layer 8. With these reactions proceeding, there occurs a deficiency of silicon at the interface between a silicide layer 12a produced in silicon substrate 1 and unreacted silicon substrate 1. If air gap is produced or impurities deposit at the deficient portion, an insulator layer 13 is formed (see FIG. 5A). An equivalent circuit of resistance between unreacted metal layer 8 and silicon substrate 1 in this state is shown in FIG. 5B. In the figure, a symbol Ri denotes a resistance value of insulator layer 13.

For each case of (1), (2), (3), each total resistance value of the interconnection and the contact portion will now be described with reference to each equivalent circuit diagram (FIG. 3B, 4B, 5B). In the case of (1), a resistance value between the surface of metal silicide layer 12 and that of silicon substrate 1 becomes a series connection of $R_s$ and $R_p$, i.e., $R_s + R_p$. A resistance value between metal silicide layer 12 and the surface of silicon substrate 1 is Rs in the case of (2), while a resistance value between metal layer 8 and silicon substrate 1 becomes a series connection of $R_s$ and $R_i$, i.e., $R_s + R_i$ in the case of (3).

Assuming that the resistance value Rs of metal silicide layer 12 is equal in all the cases of (1), (2), (3), an inequality $R_s < R_s + R_p < < R_s + R_i$ is given, and thus the minimal resistance value can be obtained in case where the (2) case (FIG. 4A) is implemented.

This result is also exhibited by a change in sheet resistance in case where the initial thickness of polysilicon is 1000 Å and polysilicon layer 7 is partially or entirely silicidized by the foregoing process, as shown in FIG. 6. More specifically, the sheet resistance of polysilicon which is not silicidized at all is several $100\Omega/\square$, whereas the sheet resistance becomes decreased as the film thickness of silicide becomes increased and then attains a lower resistance value of approximately $1\Omega/\square$ when all the polysilicon is silicidized.

Meanwhile, in case where the excessive amount of metal remains unreacted, as shown in FIG. 5A, insulator layer 13 is formed at the contact portion between metal silicide layer 12 and silicon substrate 1, resulting in a higher resistance. The change of a resistance value (hereinafter referred to as a contact resistance value) at a junction at the bottom of the contact hole from the state of FIG. 2 to the state of FIG. 5A in the case of (3) is shown in FIG. 7, which is a graph where the abscissa indicates the elapse of heat processing time, while the ordinate indicates the contact resistance value. According to this graph, the contact resistance value in case where only a portion of polysilicon layer 7 is silicidized as compared with the initial polysilicon layer 7 is approximately constant at a value a little less than $1 \times 10^{-6} \Omega.cm^2$, whereas the contact resistance value sharply increases when the time point when the entire polysilicon layer 7 is silicidized (a time point $T_1$ in the graph of FIG. 7) has passed.

As described above, all the polysilicon layer 7 need be silicidized just completely as shown in FIG. 4A in order to minimize the series resistance of the conventional contact portion and of the interconnection silicidized in a self-aligned manner. In addition, if the metal layer is slightly thicker than the case shown in FIG. 4A, insulator layer 13 of a higher resistance is formed, while if metal layer 8 is thin, unreacted polysilicon layer 7 having a higher resistance than that of the metal silicide is interposed in the contact portion. It is impossible to constantly obtain the minimum series resistance in view of difficulties in precisely controlling the film thickness of metal layer 8 and polysilicon layer 7.

SUMMARY OF THE INVENTION

One object of the present invention is to provide a semiconductor device including an interconnection of a silicide layer which is rendered conductive with a conductor layer having a silicon crystal with a minimal contact resistance.

Another object of the present invention is to provide a method of manufacturing a semiconductor device, which upon forming a metal silicide layer electrically connected with a conductor layer including a silicon crystal through a contact hole, makes it possible to prevent formation of an insulator film in the vicinity of a contact portion on the conductor layer side and to minimize a series resistance of the metal silicide layer, contact portion and conductor layer, in the step of silicidation.

In order to achieve the above objects, the semiconductor device of the invention includes a conductor layer having a silicon crystal, an insulator layer formed on the surface of the conductor layer, an interconnecting portion formed at a predetermined position in the insulator layer and having an opening, the bottom surface of which coincides with the surface of the conductor layer, a barrier layer formed at least on the surface of the conductor layer in the interconnecting portion, and a metal silicide layer formed on the barrier layer.

In accordance with this semiconductor device, the barrier layer prevents a suction of silicon from the conductor layer to the metal silicide layer. Accordingly, such a phenomenon is prevented that a deficiency produced on the conductor layer side causes an increase in insulation resistance.

In the present invention, titanium nitride and titanium silicide are preferably employed as the barrier layer and metal silicide, respectively.

For example, the structure of the present invention is employed for an interconnection of source/drain regions in a MOS field effect transistor formed on a silicon substrate, and further employed for a contact portion of a multi-layer interconnection formed in an upper layer of the interconnection.

In order to achieve the above-described objects, the method of manufacturing the semiconductor device according to the present invention includes the steps of: forming an insulator layer on a conductor layer including a silicon crystal; forming an opening in the insulator layer so as to expose the surface of the conductor layer; forming a barrier layer on an inner surface of this opening and on the surface of the insulator layer; depositing a polysilicon layer on the barrier layer; selectively removing and patterning the polysilicon layer and barrier layer, if necessary; forming a metal layer on the patterned polysilicon layer and on the insulator layer; reacting this metal layer with the polysilicon layer to transform the entire polysilicon layer into a metal silicide layer; and selectively removing only unreacted metal left on the insulator layer and on the metal silicide layer and only unsilicidized metal compounds.

According to this manufacturing method, since the barrier layer is formed in the contact portion between the conductor layer and the polysilicon layer to be silicidized, prior to the step of silicidation, it is possible to prevent a movement of metal into the contact portion and a suction of silicon from the silicon substrate and from polysilicon interconnection portion even in case where all the polysilicon layer is silicidized and the unreacted metal layer remains. This avoids the occurrence of deficiencies of silicon in the vicinity of the contact portion in the conductor layer including the silicon crystal. This makes it possible to prevent such a phenomenon that air gap is produced and an insulator is deposited at the deficient portion, resulting in formation of an insulator layer. Consequently, there occurs no inconvenience even in case where the metal layer is formed in a thickness enough and excessive for silicidation of the whole polysilicon layer compared to the thickness of the polysilicon layer before silicidized. This makes it possible to maintain resistance values of the polysilicon interconnection and contact portion at a stable minimal value.

The thickness of the metal layer before silicidized which is equal to or larger than about half the thickness of the polysilicon layer is sufficient for the silicidation of the entire polysilicon layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will now be described with reference to FIGS. 8A, 8B and 9A–9E.

Figure 1A:
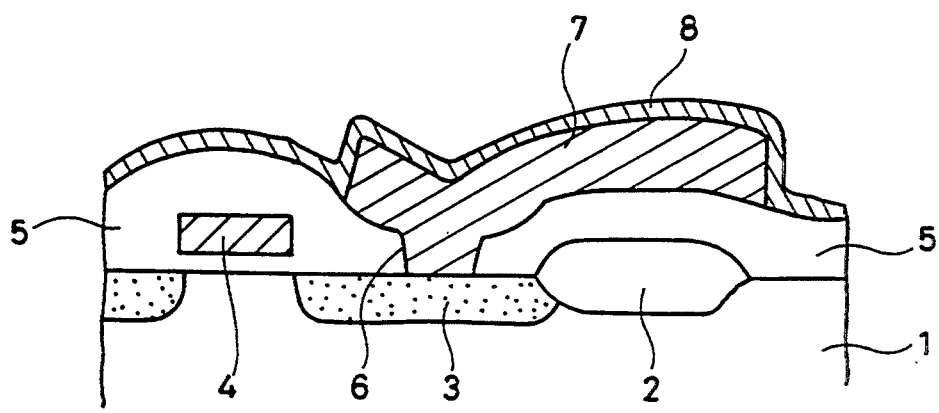
FIG. 1A is a cross-sectional view showing a conventional semiconductor device in which a salicide interconnection is formed on a silicon substrate, in a state before silicidized by a heat treatment.
Figure 8A:
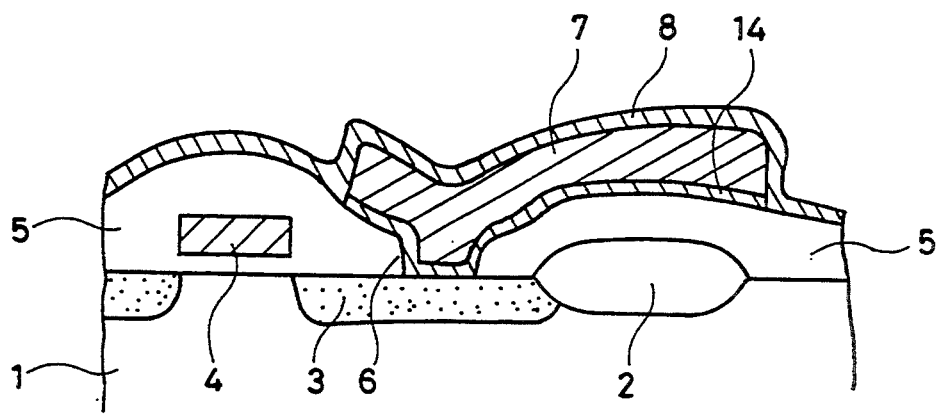
FIG. 8A is a cross-sectional view of a semiconductor device according to a first embodiment of the present invention in a state before a heat treatment is carried out for silicidation.

A semiconductor device according to the embodiment shown in FIG. 8A is structured such that the present invention is applied to an interconnection of source/drain regions of a MOS (Metal Oxide Semiconductor) field effect transistor. FIG. 8A, corresponding to FIG. 1A of the conventional art, shows a structure before subjected to silicidation for forming an interconnection having a salicide structure and forming a contact. The structure shown in FIG. 8A is formed by the manufacturing steps shown in FIGS. 9A–9E. In the manufacture of the structure shown in FIG. 8A, an impurity diffusion layer 3 doped with impurity ions such as phosphorus, a gate electrode 4 and an insulator layer 5 are first formed by CVD method, for example, in regions isolated by a field oxide film 2 in the surface of a silicon substrate 1. A contact hole 6 is then formed in insulator layer 5 on the region of impurity diffusion layer 3 by etching. Thereafter, titanium nitride is deposited to a thickness of several 100 Å on the entire surface of insulator layer 5 and on the inner circumferential surface and the bottom surface of contact hole 6 by CVD method, thereby to form a barrier layer 14. The barrier layer 14 may be formed to a thickness sufficient to prevent a movement of metals in a metal layer 8 or movement of silicon atoms from silicon substrate 1. The titanium nitride which is a material of barrier layer 14 is a conductive metal, the resistivity of which is extremely low at approximately 50 $\mu\Omega$.cm. On the other hand, a polysilicon layer 7 doped with impurities has a normal thickness and has a sheet resistance value of 50-several 100$\Omega$/□. Even after doped with phosphorus or arsenic and then activated by a heat treatment, polysilicon layer 7 has a sheet resistance value of approximately 2–3$\Omega$/□. Therefore, the resistance value of barrier layer 14 is almost negligible.

Figure 9A:
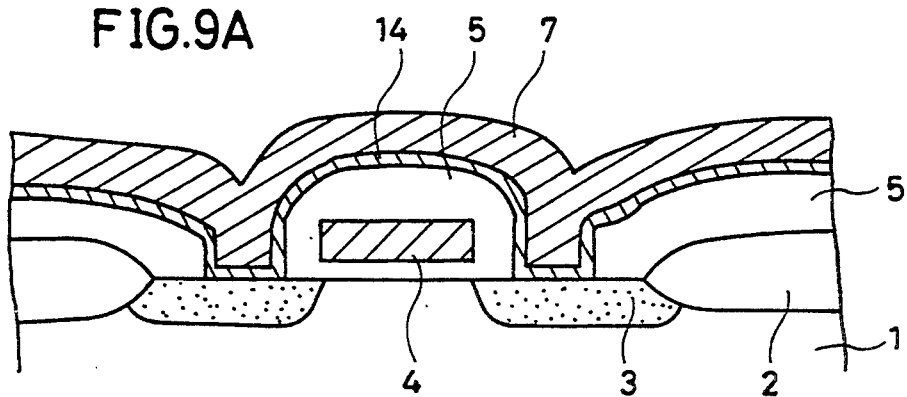
FIGS. 9A, 9B, 9C, 9D and 9E are cross-sectional views showing the processing steps in a method of manufacturing a semiconductor device according to the first embodiment of the present invention.
Figure 9B:
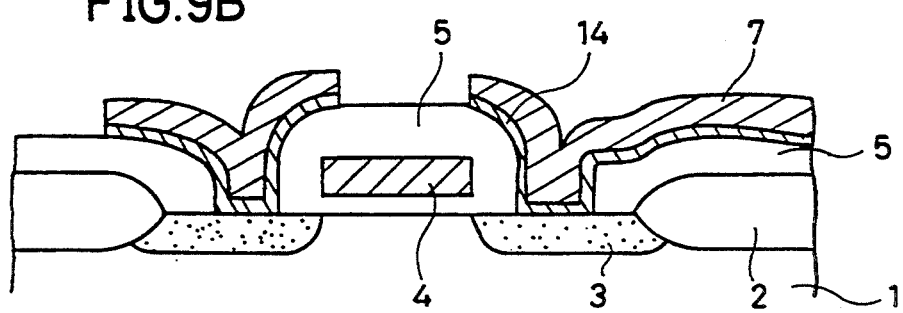

After the formation of barrier layer 14, polysilicon layer 7 is formed on the overall surface of barrier layer 14 again by CVD method (see FIG. 9A). Thereafter, both polysilicon layer 7 and barrier layer 14 are patterned by employing both techniques of lithography and etching. A normal dry etching such as plasma etching or RIE (Reactive Ion Etching) is available for the etching. FIG. 9B shows the cross section of the structure after subjected to this etching.

Figure 9C:
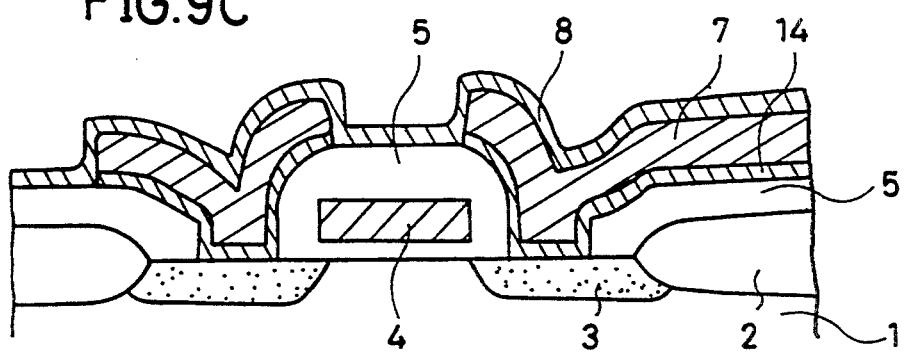

Next, metal layer 8 to be used for silicidation of titanium or the like is formed on the surface of polysilicon layer 7 and entirely on the exposed surface of insulator layer 5 by sputtering or the like (see FIG. 9C). The thickness of metal layer 8 at this time is set such that all the lower portions of polysilicon layer 7 can be silicidized and that a surplus can be made. In general, the thickness of metal layer 8 may be about a half or more the thickness of polysilicon layer. When the thickness of polysilicon layer 7 is 1000 Å, for example, an appropriate thickness of metal layer 8 made of titanium is about 550–600 Å.

Figure 5A:
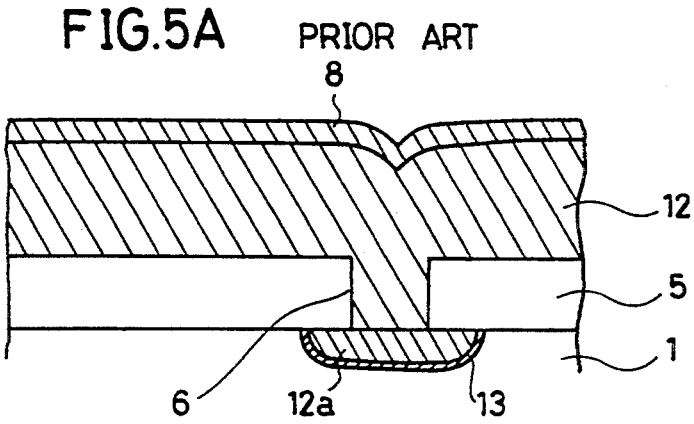
FIG. 5A is a cross-sectional view showing a state after silicidation in which the thickness of metal layer 8 before subjected to silicidation is relatively too thick compared to the thickness of polysilicon layer 7 in accordance with a conventional method of forming a salicide interconnection.
Figure 5B:
FIG. 5B is an equivalent circuit diagram of a series resistance thereof.
Figure 6:
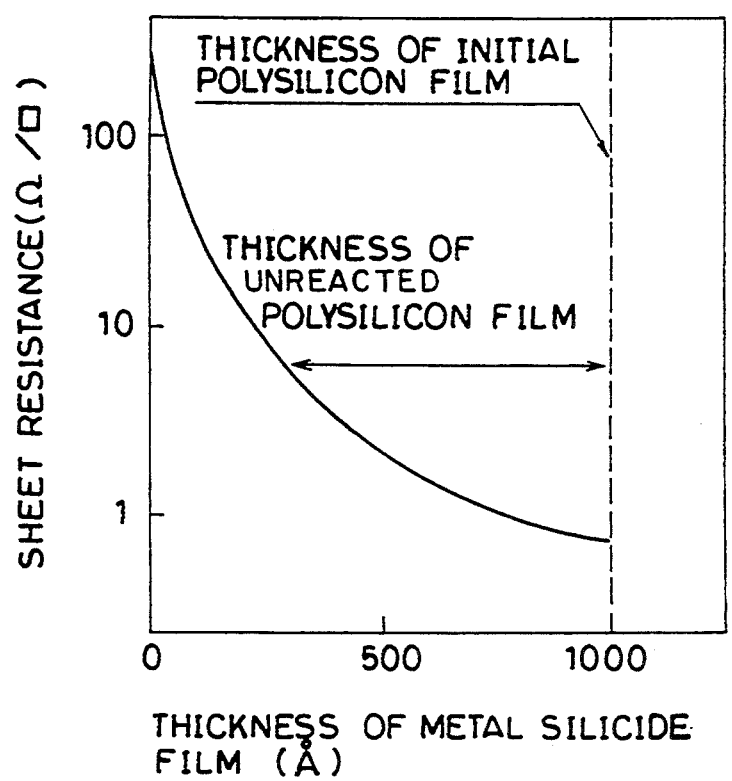
FIG. 6 is a graph showing the relation between a film thickness of silicidized portion in a polysilicon film of 100 Å and a sheet resistance value.
Figure 7:
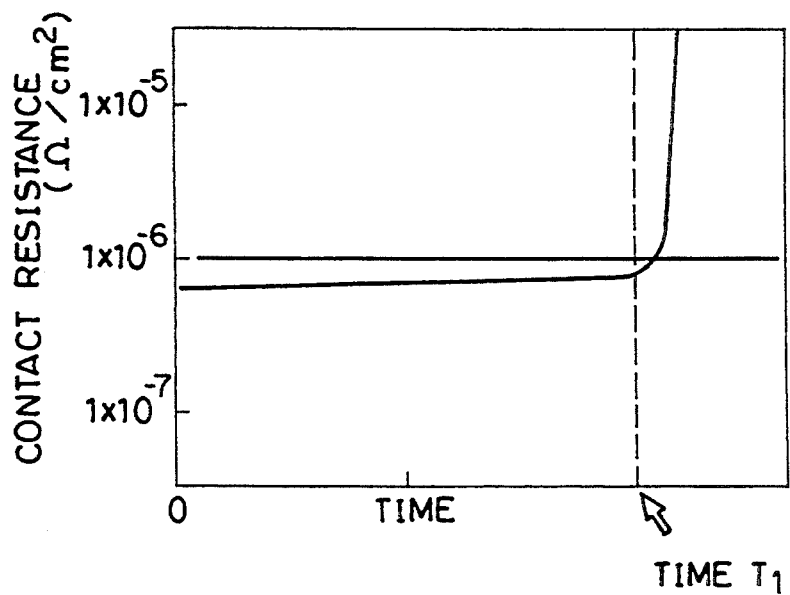
FIG. 7 is a graph showing the relation between a heat treatment time for silicidation and a contact resistance value in accordance with a conventional method of forming a salicide interconnection.
Figure 9D:
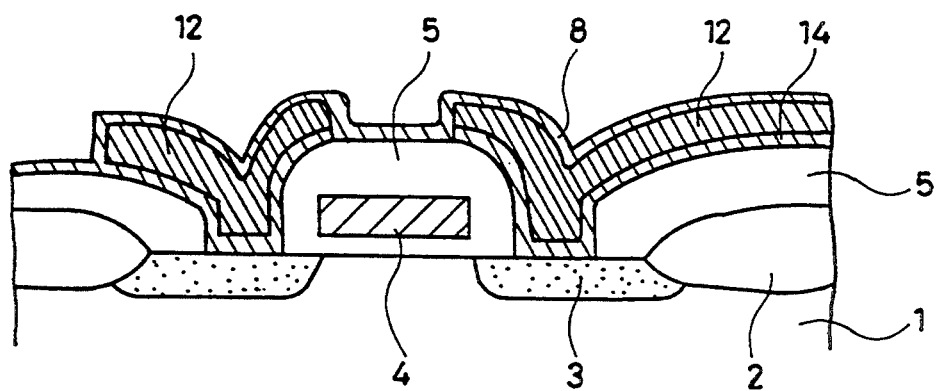
Figure 9E:
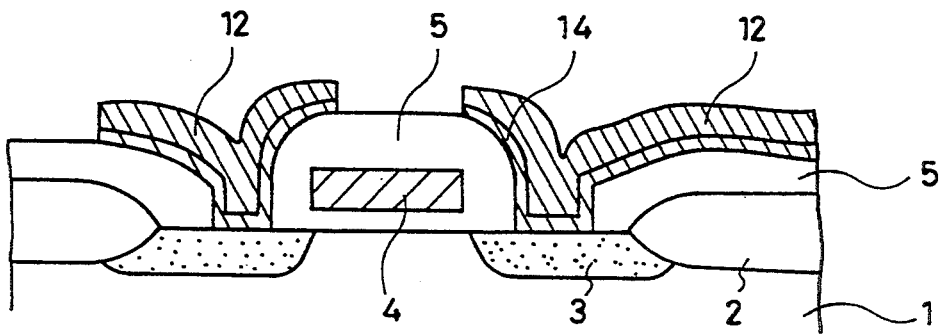

Then, silicidation is generated between polysilicon layer 7 and metal layer 8 by, for example, a heat treatment at 700° C. for about 30–60 sec employing an RTA (Rapid Thermal Anneal) method in argon atmosphere. As shown in FIG. 9D, even after the entire polysilicon layer 7 is reacted and silicidized, unreacted metal layer 8 is still left. If unreacted metal layer 8 is now removed by, e.g., sulfuric acid in the case of titanium, a silicide interconnection is formed in a self-aligned manner. FIG. 9E shows a cross-sectional structure after a metal silicide layer 12 is obtained. Since the titanium nitride to be barrier layer 14 is formed in a contact portion, unreacted metal layer 8 makes it possible to prevent a suction of silicon from silicon substrate 1 and the formation of insulator layer 13 shown in FIG. 5A and further to implement an interconnection and contact portion having a lower resistance.

In the above described embodiment, the titanium nitride is first deposited on the entire surface of insulator layer 5 and on the inner circumferential surface and the bottom surface of contact hole 6 upon formation of barrier layer 14; however, similar reacting effects can be achieved even by selectively forming a barrier layer on the bottom surface of contact hole 6, i.e., only the silicon substrate in a contact opening portion by covering regions other than contact hole 6 with mask.

In addition, it is possible to make an arbitrary determination as to the film thickness of the metal silicide layer 12 so that the metal silicide layer may have a necessary resistance value, and then possible to set the relative ratio of the thickness of metal layer 8 prior to the silicidation process to that of polysilicon layer 7 so that the relative ratio may be adapted to the determined thickness of the metal silicide layer.

While the titanium has been applied by way of example as metal species for forming metal silicide layer 12, any metals capable of forming silicide in a self-aligned manner may be employed such as other refractory metals, e.g., tantalum, tungsten, molybdenum, cobalt, nickel, chromium, platinum, palladium etc. without being limited to titanium.

Figure 1B:
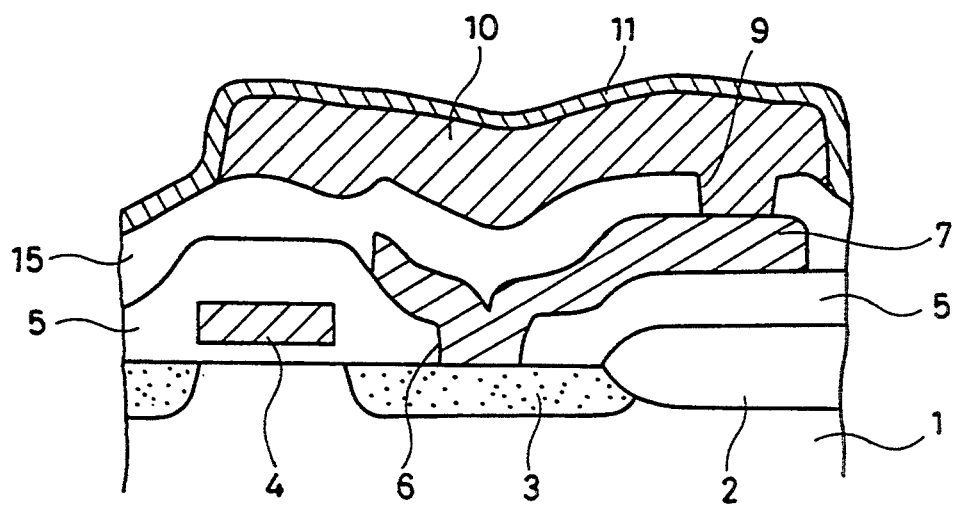
FIG. 1B is a cross-sectional view of a conventional semiconductor device in which a metal silicide interconnection layer is further formed on a silicon interconnection layer in a state before silicidized.
Figure 2:
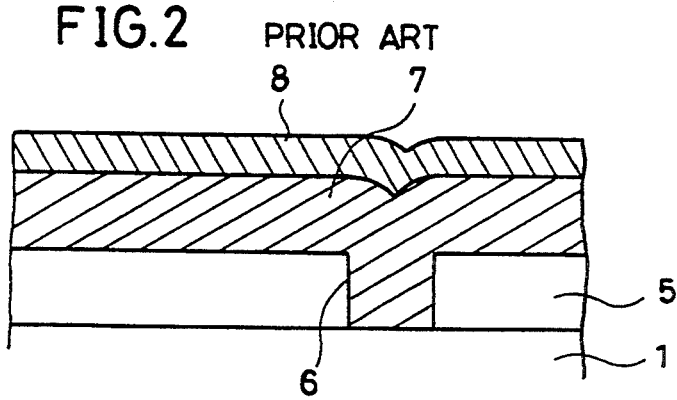
FIG. 2 is a view showing a cross section of a polysilicon layer 7 and a metal layer 8 in a state before silicidized by a heat treatment in accordance with a conventional method of forming a metal silicide interconnection layer.
Figure 3A:
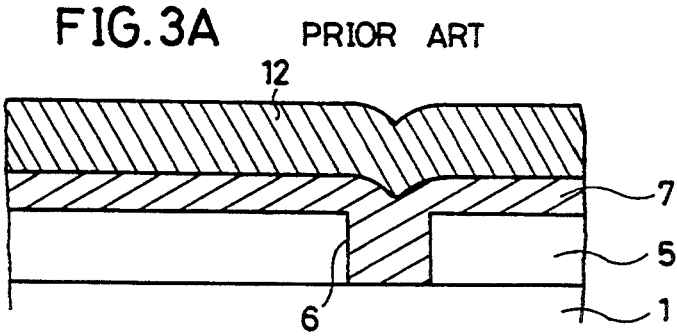
FIG. 3A is a cross-sectional view after silicidation in which the thickness of metal layer 8 before subjected to silicidation shown in FIG. 2 is relatively too small compared to the thickness of polysilicon layer 7 in accordance with a conventional method of forming a salicide interconnection.
Figure 3B:
FIG. 3B is an equivalent circuit diagram of a series resistance thereof.
Figure 4A:
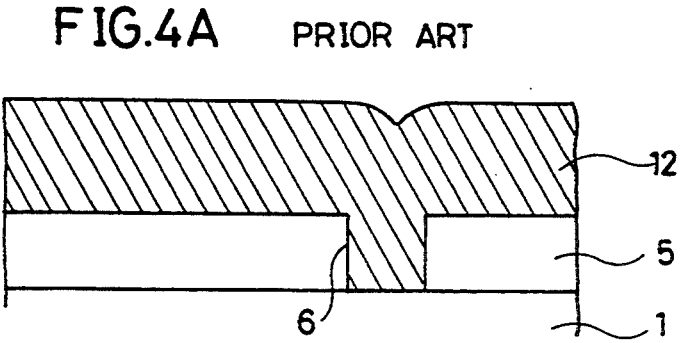
FIG. 4A is a cross-sectional view showing a state after silicidation in which the thickness of metal layer 8 before subjected to silicidation and the thickness of polysilicon layer 7 are relatively in an optimal relation in accordance with a conventional method of forming a salicide interconnection.
Figure 4B:
FIG. 4B is an equivalent circuit diagram of a series resistance thereof.
Figure 8B:
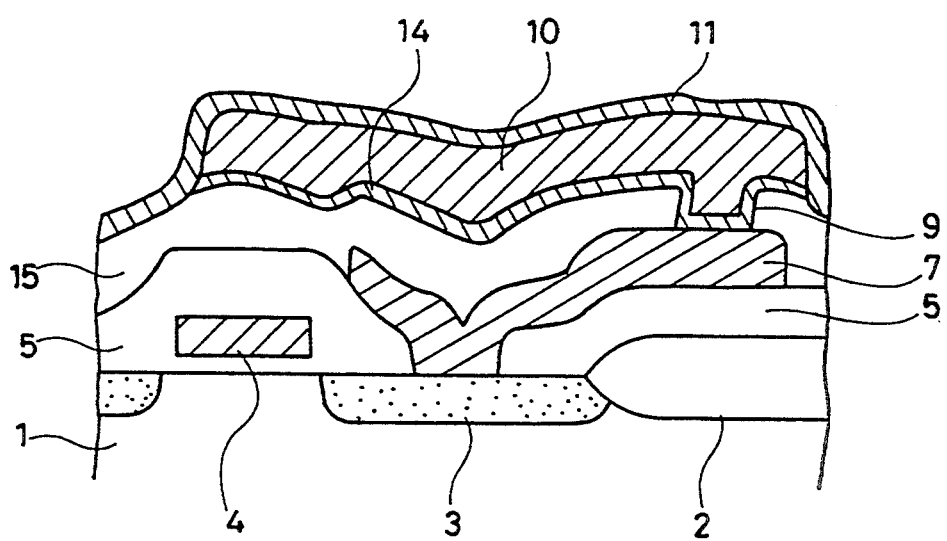
FIG. 8B is a cross-sectional view of a semiconductor device according to a second embodiment of the present invention in a state before a heat treatment is carried out for silicidation.

The second embodiment of the present invention will now be described with reference to FIG. 8B. In this embodiment, the present invention is applied to a multilayer interconnection formation in which a conductive interconnection layer is further formed, with an insulator film sandwiched therebetween, on an upper layer of a polysilicon interconnection electrically connected directly to source/drain regions of a MOS field effect transistor. FIG. 8B, corresponding to FIG. 1B of the conventional art, shows a cross-sectional structure of a semiconductor device according to the second embodiment in a state before silicidized by a heat treatment. In this embodiment, an insulator layer 15 is further formed on the surface of a polysilicon layer 7 and on the exposed surface of an insulator layer 5, and then a metal silicide interconnection layer is formed on insulator layer 15. After insulator layer 15 is formed to cover the surface of polysilicon layer 7 by CVD method, a contact hole 9 is made in insulator layer 15 on the region of polysilicon layer 7 by etching. Then, titanium nitride is deposited to a thickness of several 100 Å on the surface of insulator layer 5 and on the overall inner surface of contact hole 9 by CVD method, thereby to form a barrier layer 14. After a polysilicon layer 10 is then formed on barrier layer 14 again by CVD method, unnecessary polysilicon and titanium nitride are removed by etching. Then, a metal layer 11 formed such as of titanium is formed on the surface thereof by sputtering, resulting in the cross-sectional structure shown in FIG. 8B.

Figure 10:
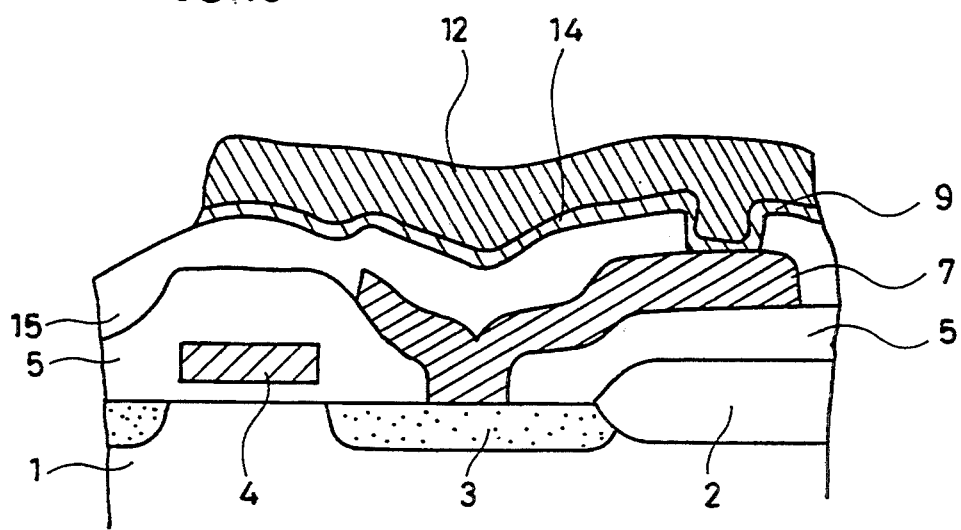
FIG. 10 is a cross-sectional view showing the structure of the semiconductor device, after a metal silicide layer 12 is formed and an unreacted metal layer is removed, according to the second embodiment of the present invention.

Thereafter, a heat treatment is carried out at about 700° C. for a predetermined time to advance a silicidation between polysilicon layer 10 and metal layer 11, so as to form a metal silicide interconnection layer 12. Then, when unreacted metal layer 11 is removed, a cross-sectional structure shown in FIG. 10 is perfected.

The semiconductor device of this embodiment thus structured can also obtain a contact portion and a metal silicide interconnection having a superior conductivity due to the similar reacting effects to those of the above-described first embodiment.

While the titanium nitride is employed as a material of barrier layer 14 in both of the above-described embodiments, other metals such as an alloy of titanium and tungsten, for example, may be employed without being limited to the titanium nitride.

As has been described heretofore, according to the preferred embodiments of the present invention, the formation of the barrier layer in the contact portion between the surface of the silicon substrate and the polysilicon layer to be silicidized or in the contact portion between the polysilicon layer and the polysilicon interconnection layer prevents the movement of unreacted metals and the suction of silicon from the silicon substrate through the contact portion. This consequently prevents the occurrence of such a phenomenon that a deficiency of silicon is produced in the silicon substrate in the vicinity of the contact portion and hence the insulator layer is formed in that deficient portion, resulting in the interconnection of and the interconnecting portion of the salicide structure having a superior conductivity.

Figure 11:
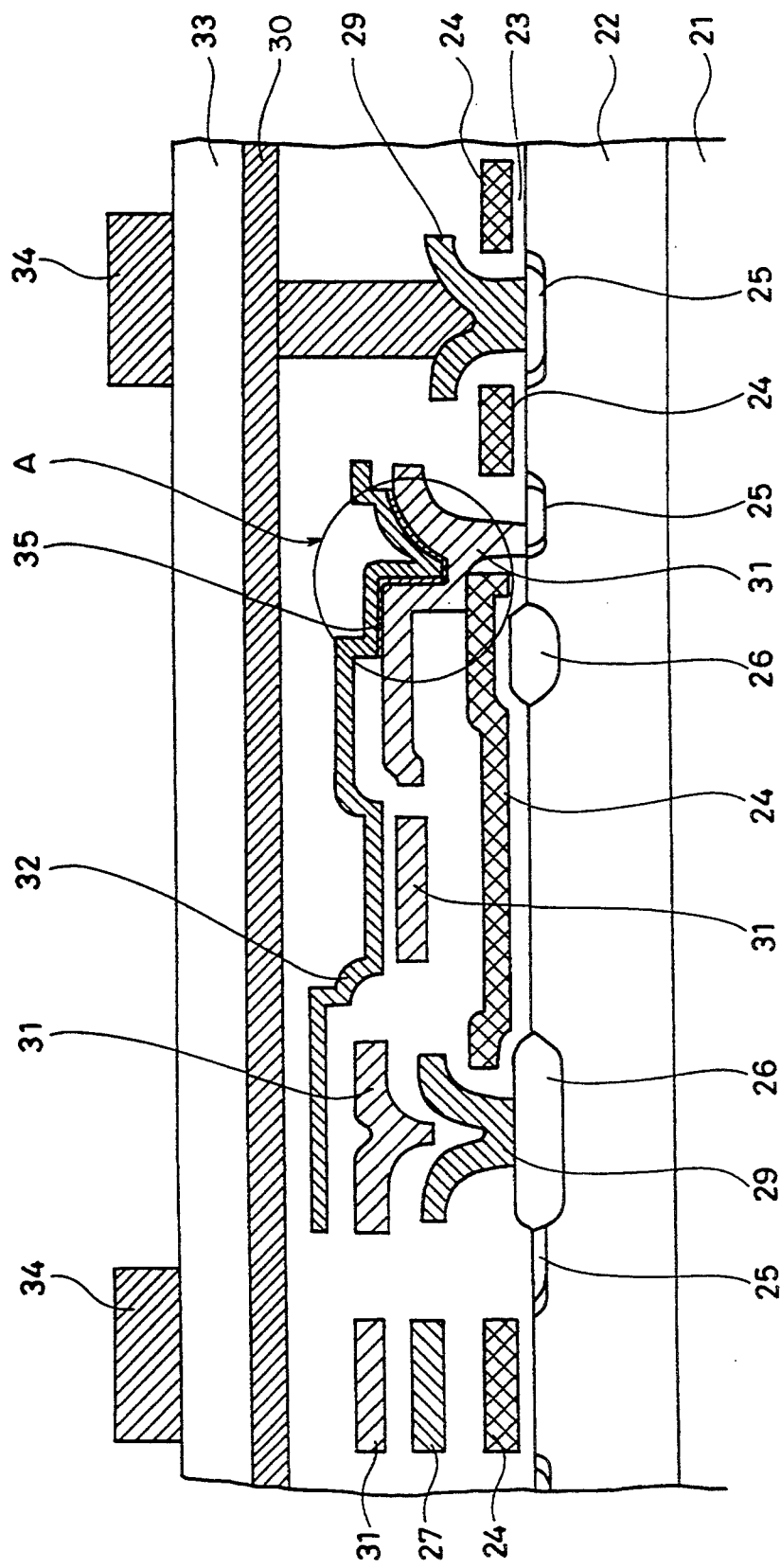
FIG. 11 is a cross-sectional view showing an example in which the present invention is applied to a memory cell of a SRAM.

Next, a description will now be given on a specific example in which the present invention is applied to a semiconductor device. FIG. 11 shows a cross-sectional structure in case where the present invention is applied to a memory cell of a SRAM (Static Randon Access Memory). In this memory cell of the SRAM, a first polysilicon layer 24 is formed on a p type well 22 formed in the vicinity of a surface of a semiconductor substrate 21, with a gate insulator film 23 sandwiched therebetween. n type impurity diffusion layers 25 are formed in a predetermined position on a surface of p well 22, with first polysilicon layer 24 interposed therebetween, so as to form source/drain regions of a MOS field effect transistor. An insulator film 26 for isolation is formed in another predetermined position on the surface of p well 22. A second polysilicon layer 31 and a poly-pad 29 are formed above first polysilicon layer 24 with an interlayer insulation film 27 therebetween. Poly-pad 29 is junctioned with the p well in the surface of impurity diffusion layer 25 to be a drain region and further connected to a first aluminium layer 30 for applying a predetermined fixed potential to the p well. A second polysilicon layer 31 and a third polysilicon layer 32 are formed in predetermined regions on poly-pad 29. The surface of first aluminium layer 30 is covered with a passivation film 33, on the surface of which a second aluminium layer 34 is formed. First polysilicon layer 24 and second polysilicon layer 31 are junctioned and second polysilicon layer 31 and third polysilicon layer 32 are junctioned in a portion enclosed by a circle A in FIG. 10. In the memory cell of the SRAM, the present invention is applied to the junction portion between second and third polysilicon layers 31 and 32 in circle A. That is, a barrier layer 35 made of titanium nitride and formed through the similar steps to the second embodiment is interposed between the junction surfaces of second and third polysilicon layers 31 and 32 in circle A. This barrier layer enables a reduction in contact resistance between second and third polysilicon layers 31 and 32 without deficiencies of silicon, resulting in enhancement in characteristics of the memory cell.

Figure 12:
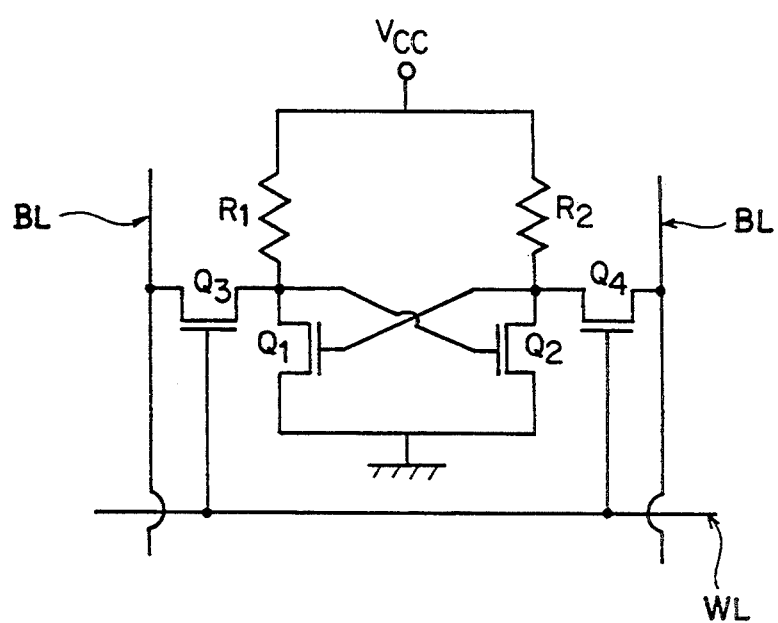
FIG. 12 is an equivalent circuit diagram of the memory cell of the SRAM shown in FIG. 11.

The cross-sectional structure shown in FIG. 11 is a part of a memory cell of an NMOS type SRAM shown by an equivalent circuit in FIG. 12. NMOSFETs denoted with $Q_1$ and $Q_2$ in FIG. 12 correspond to NMOSFETs $Q_1$ and $Q_2$ shown in FIG. 11, and first aluminium layer 30 corresponds to a conductive interconnection layer connected with a ground electrode. Third polysilicon layer 32 corresponds to a high resistance $R_1$ of FIG. 12, and second polysilicon layer 31 corresponds to a conductive interconnection. Second aluminium layer 34 serves as a bit line shown by the arrow BL in FIG. 12.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A manufacturing method of a semiconductor device, comprising the steps of:
    forming a conductor layer including a silicon crystal;
    forming an insulator layer on the conductor layer;
    forming an opening in said insulator layer so as to expose a surface of said conductor layer;
    forming a barrier layer on an inner surface of the opening and on a surface of said insulator layer;
    depositing a polysilicon layer on said barrier layer;
    forming a metal layer on said polysilicon layer and on said insulator layer;
    reacting said metal layer with said polysilicon layer to transform all of said polysilicon layer into a metal silicide layer.

2. The method according to claim 1, wherein the step of forming said barrier layer is carried out by depositing titanium nitride by a CVD method.

3. The method according to claim 1, wherein the step of forming said metal layer is carried out by depositing a metal selected from the group consisting of titanium, tantalum, tungsten, nickel, cobalt, chromium, platinum and palladium by sputtering.

4. The method according to claim 1, wherein the thickness of said metal layer is a half or more as large as the thickness of said polysilicon layer.

5. The method according to claim 1, wherein
    titanium is employed as a material of said metal layer; and
    the step of reacting said metal layer with said polysilicon layer to transform said polysilicon layer entirely into the metal silicide includes a silicidation by a heat treatment at approximately 700° C. for 30–60 sec in an argon atmosphere.

* * * * *